United States Patent
Kim et al.

(10) Patent No.: US 10,635,351 B2
(45) Date of Patent: Apr. 28, 2020

(54) SEMICONDUCTOR DEVICE FOR SCHEDULING TASKS FOR MEMORY DEVICE AND SYSTEM INCLUDING THE SAME

(71) Applicants: SK hynix Inc., Icheon (KR); Seoul National University R&DB Foundation, Seoul (KR)

(72) Inventors: Bryan Suk Joon Kim, Seoul (KR); Sang Lyul Min, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 21 days.

(21) Appl. No.: 15/914,915

(22) Filed: Mar. 7, 2018

(65) Prior Publication Data

US 2019/0155542 A1    May 23, 2019

(30) Foreign Application Priority Data

Nov. 17, 2017  (KR) .................. 10-2017-0153547

(51) Int. Cl.
  *G06F 9/46*   (2006.01)
  *G06F 3/06*   (2006.01)
  *G06F 12/02*  (2006.01)
  *G11C 16/10*  (2006.01)
  *G06F 13/16*  (2006.01)
  *G06F 13/18*  (2006.01)

(52) U.S. Cl.
  CPC .......... *G06F 3/0659* (2013.01); *G06F 3/061* (2013.01); *G06F 3/0611* (2013.01); *G06F 3/0616* (2013.01); *G06F 3/0619* (2013.01); *G06F 3/0652* (2013.01); *G06F 3/0679* (2013.01); *G06F 12/0246* (2013.01); *G06F 13/1652* (2013.01); *G06F 13/18* (2013.01); *G11C 16/10* (2013.01)

(58) Field of Classification Search
  CPC ........................................................ G06F 9/52
  USPC ........................................................ 718/104
  See application file for complete search history.

(56) References Cited

U.S. PATENT DOCUMENTS

2003/0061264 A1*  3/2003  Benhase ................. G06F 9/505
                                                          718/105
2007/0234365 A1* 10/2007  Savit ...................... G06F 9/505
                                                          718/104
2008/0295104 A1* 11/2008  Fujihara ................ G06F 9/4887
                                                          718/103

(Continued)

FOREIGN PATENT DOCUMENTS

KR       100746036 B1    8/2007
KR     1020070111470 A  11/2007

(Continued)

*Primary Examiner* — Mehran Kamran (57) ABSTRACT

A semiconductor device may include a task controller configured to generate a target share for a plurality of task generators according to respective target states and respective measured states of the plurality of task generators, a task scheduler configured to schedule the plurality of tasks according to an allocated share, the plurality of tasks being provided from the plurality of task generators, and a share controller configured to determine the allocated share according to the target share and a measured share of the plurality of task generators.

17 Claims, 4 Drawing Sheets

(56) References Cited

U.S. PATENT DOCUMENTS

| | | | |
|---|---|---|---|
| 2010/0115168 A1* | 5/2010 | Bekooij | G06F 9/48 710/244 |
| 2011/0239220 A1* | 9/2011 | Gibson | G06F 1/3206 718/103 |
| 2012/0180064 A1* | 7/2012 | Helander | G06F 9/4887 718/104 |
| 2013/0212277 A1* | 8/2013 | Bodik | G06F 9/4887 709/226 |
| 2013/0290972 A1* | 10/2013 | Cherkasova | G06F 9/5066 718/103 |
| 2014/0129864 A1* | 5/2014 | Sun | G06F 1/3206 713/324 |
| 2014/0156623 A1* | 6/2014 | Guha | G06F 16/95 707/706 |
| 2015/0186830 A1* | 7/2015 | Dossing | G06Q 10/063114 705/7.15 |
| 2015/0356518 A1* | 12/2015 | De | G06Q 10/1097 705/7.21 |
| 2016/0330075 A1* | 11/2016 | Tiwari | H04L 41/0806 |
| 2017/0177045 A1* | 6/2017 | Seo | G06F 1/206 |
| 2017/0249193 A1* | 8/2017 | Brech | H04L 43/14 |
| 2018/0101406 A1* | 4/2018 | Hirsch | G06F 9/4881 |
| 2018/0181380 A1* | 6/2018 | Kasahara | G06F 8/456 |
| 2018/0255122 A1* | 9/2018 | Hu | H04L 47/72 |
| 2018/0314562 A1* | 11/2018 | Kurian | G06F 9/5027 |
| 2018/0365072 A1* | 12/2018 | Li | G06F 9/4881 |
| 2019/0129635 A1* | 5/2019 | Gans | G06F 3/0604 |

FOREIGN PATENT DOCUMENTS

| | | |
|---|---|---|
| KR | 1020090044927 A | 5/2009 |
| KR | 1020100102283 A | 9/2010 |
| KR | 1020110118296 A | 10/2011 |
| KR | 1020160036693 A | 4/2016 |
| KR | 1020160063954 A | 6/2016 |
| KR | 1020170042135 A | 4/2017 |

* cited by examiner

FIG. 1

<Prior Art>

| task | function | State |
|---|---|---|
| Host request | Read, write | latency |
| Wear level request | Equalizing erase count | Maximum erase count – Minimum erase count |
| Garbage collection request | Reclaim free blocks | Number of free blocks |

FIG. 4

SEMICONDUCTOR DEVICE FOR SCHEDULING TASKS FOR MEMORY DEVICE AND SYSTEM INCLUDING THE SAME

CROSS-REFERENCE TO RELATED APPLICATION

The present application claims priority to Korean Patent Application No. 10-2017-0153547, filed on Nov. 17, 2017, which is incorporated herein by reference in its entirety.

BACKGROUND

1. Field

Embodiments of the present disclosure relate to a semiconductor device scheduling a plurality of tasks for memory devices and a system including the semiconductor device.

2. Description of the Related Art

Figure 1:
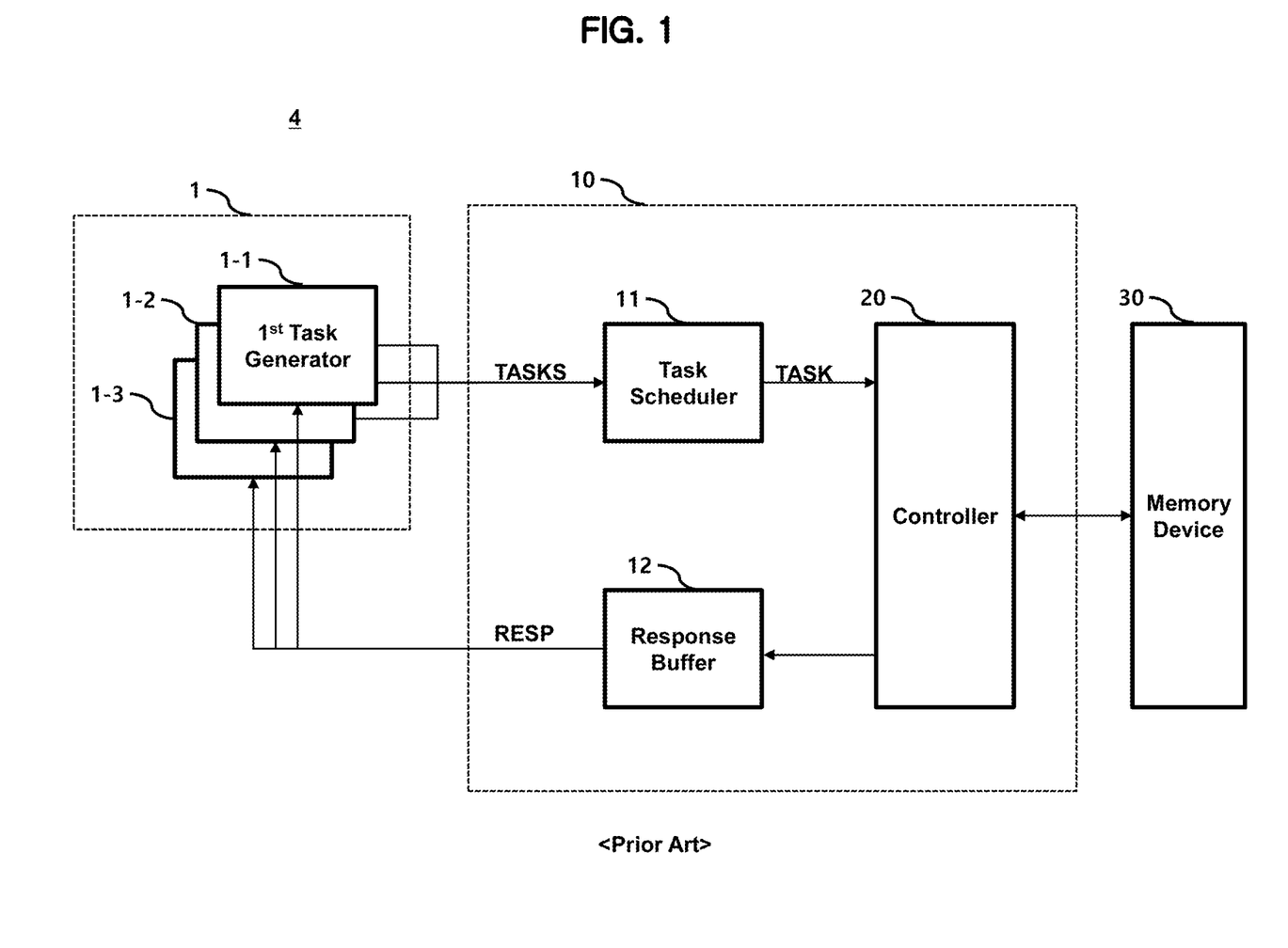
FIG. 1 illustrates a conventional memory system.

FIG. 1 is a block diagram illustrating a conventional memory system 4.

The conventional memory system 4 includes a plurality of task generators 1 which generate a plurality of task signals TASKS respectively indicating a plurality of tasks, a conventional semiconductor device 10, and a memory device 30.

The memory device 30 is, for example, a flash memory device.

The conventional semiconductor device 10 includes a task scheduler 11, a response buffer 12, and a controller 20.

The task scheduler 11 schedules the plurality of tasks and generates a scheduled signal TASK indicating one of the scheduled tasks.

The controller 20 controls the memory device 30 by generating a control command corresponding to the scheduled signal TASK.

The response buffer 12 receives a response signal RESP indicating a response output from the memory device 30 and provides the response signal RESP to a corresponding one of the plurality of task generators 1.

The plurality of task generators 1 include a first task generator (e.g., a host) 1-1 for generating a read/write request, a second task generator (e.g., a wear level controller) 1-2 for controlling a wear leveling operation, a third task generator (e.g., a garbage collection controller) 1-3 for controlling garbage collection.

In the conventional semiconductor device 10, the task scheduler 11 schedules the plurality of tasks provided by the first, second, and third task generators 1-1, 1-2, and 1-3 according to predetermined rules such as a time sequence.

Because the conventional semiconductor device 10 operates according to such predetermined rules, it is difficult to adjust a priority of a specific type of task.

SUMMARY

Various embodiments are directed to a semiconductor device for scheduling a plurality of tasks provided from a plurality of task generators by variably adjusting shares of the plurality of task generators and a system including the semiconductor device.

In an embodiment, a semiconductor device may include a task controller configured to generate a target share for a plurality of task generators according to respective target states and respective measured states of the plurality of task generators, a task scheduler configured to schedule the plurality of tasks according to an allocated share, the plurality of tasks being provided from the plurality of task generators, and a share controller configured to determine the allocated share according to the target share and a measured share of the plurality of task generators.

In an embodiment, a system may include a memory device; a plurality of task generators configured to respectively provide a plurality of tasks for the memory device; and a semiconductor device configured to control the memory device according to the plurality of tasks from the plurality of task generators, wherein the semiconductor device comprises a task controller configured to generate a target share for the plurality of task generators according to respective target states and respective measured states of the plurality of task generators; a task scheduler configured to schedule the plurality of tasks according to an allocated share; and a share controller configured to determine the allocated share according to the target share and a measured share of the plurality of task generators.

In an embodiment, a semiconductor device may include a plurality of task generators respectively generating a plurality of task signals and a plurality of measured state signals; a plurality of task controllers respectively generating a plurality of target share signals in response to the plurality of measured state signals and a plurality of target state signals; a share controller generating an allocated share signal in response to the plurality of target share signals and a measured share signal; and a task scheduler scheduling a plurality of tasks in response to the allocated share signal and generating the measured share signal, the plurality of task signals respectively indicating the plurality of tasks.

DETAILED DESCRIPTION

Hereafter, various embodiments will be described below in more detail with reference to the accompanying drawings.

Figure 2:
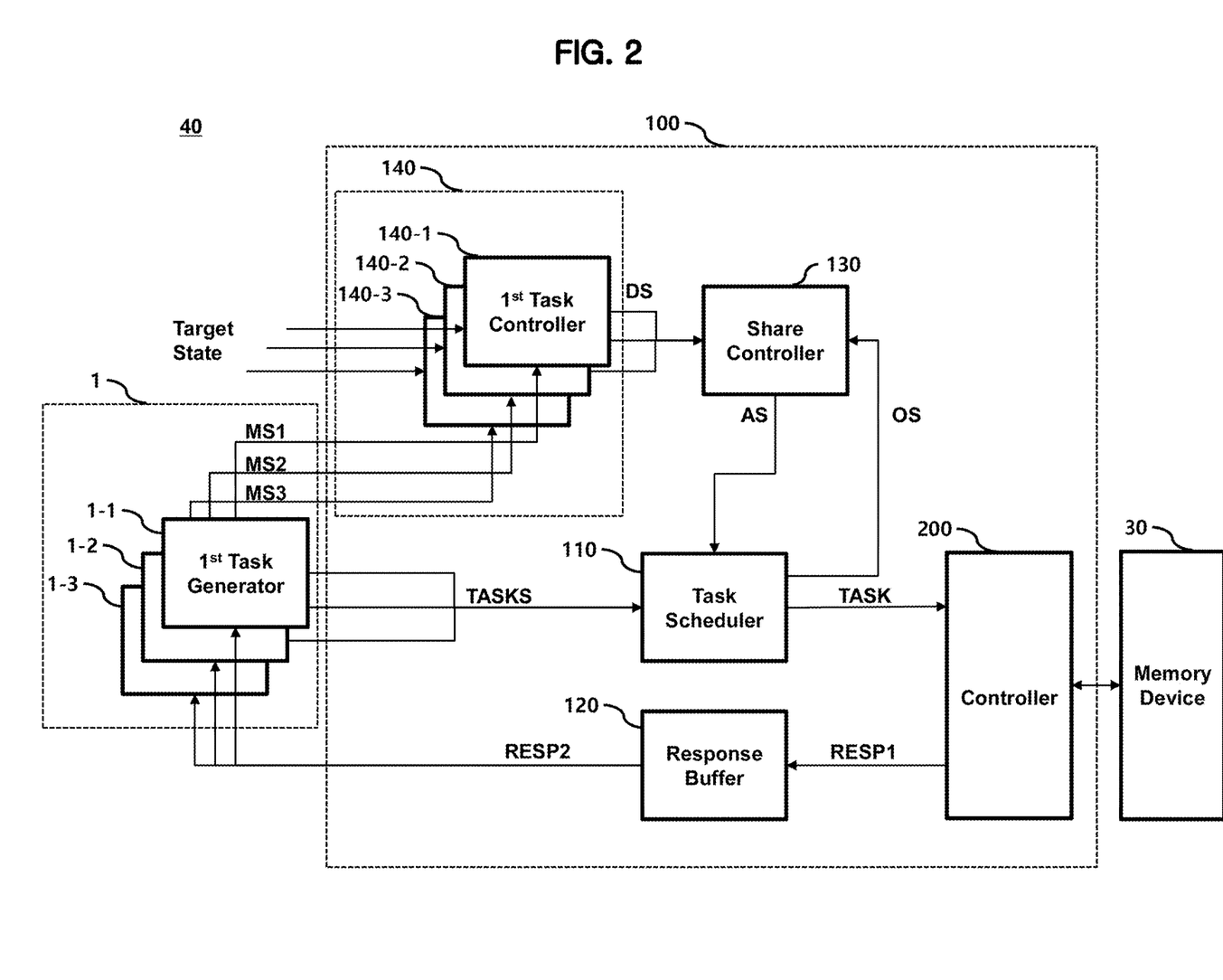
FIG. 2 illustrates a memory system according to an embodiment.

FIG. 2 is a block diagram illustrating a memory system 40 according to an embodiment of the present disclosure.

The memory system 40 includes a plurality of task generators 1 that generate a plurality of signals TASKS respectively indicating a plurality of tasks, a semiconductor device 100, and a memory device 30.

In the embodiment shown in FIG. 2, a flash memory device may be included in the memory device 30, but the type of the memory device 30 is not limited thereto.

The plurality of task generators 1 may include a first task generator (e.g., a host) 1-1 for requesting a read/write operation, a second task generator (e.g., a wear level controller) 1-2 for requesting a wear leveling operation, a third task generator (e.g., a garbage collection controller) 1-3 for performing garbage collection. In an embodiment, the plurality of task generators 1 includes an electronic circuit. In an embodiment, the plurality of task generators 1 includes a microcontroller or microprocessor executing computer programming instructions stored in a non-transitory computer-readable medium.

In the embodiment shown in FIG. 2, three types of task generators 1-1, 1-2, and 1-3 are shown, but embodiments of the present disclosure are not limited thereto. According to an embodiment, the plurality of task generator 1 may further include other types of task generators for generating different types of tasks from those performed by the task generators 1-1, 1-2, and 1-3.

The semiconductor device 100 includes a task scheduler 110, a response buffer 120, a share controller 130, a task controller 140, and a controller 200.

The task scheduler 110 receives the plurality of signals TASKS indicating the plurality of tasks provided from the first, second, and third task generators 1-1, 1-2, and 1-3, respectively, and performs scheduling of the plurality of tasks according to an allocated share.

For example, when the allocated share is 100:1:1, the task scheduler 110 schedules the plurality of tasks from the first task generator 1-1, the second task generator 1-2, and the third task generator 1-3 at a ratio of 100:1:1 for a given period of time. For example, the task scheduler 110 may use a scheduling algorithm such as weighted round robin (WRR), weighted fair queuing (WFQ), or deficit round robin (DRR) etc. In an embodiment, the given period of time corresponds to a predetermined number of periods (for example, one period) of a clock signal (not shown) provided to the task scheduler 110.

The share controller 130 receives a target share signal DS indicating a target share provided from the task controller 140 and a measured share signal OS indicating a measured share. The share controller 130 determines an allocated share signal AS indicating an allocated share in response to the target share signal DS and the measured share signal OS.

The measured share can be determined by tracing origin of tasks for a certain time. For example, the task scheduler 110 counts a number of requests associated with a task of the first, second, or third task generator 1-1, 1-2, or 1-3 for the given period of time, generates the measured share signal OS having a value indicative of a measured share of the task based on the counted number, and provides the measured share signal OS to the share controller 130, when the task scheduler 110 uses a WRR algorithm. The task scheduler 110 may use a different method according to a scheduling algorithm. For example, the measured share signal OS has first, second, and third values indicating measured shares of respective tasks from the first, second, and third task generators 1-1, 1-2, and 1-3.

The share controller 130 can increase or decrease a value of the allocated share by comparing a corresponding value of the target share and a corresponding value of the current share.

The share controller 130 may use the following equation, for example, to determine the first value of the allocated share corresponding to an allocated share of the task from the first task generator 1-1:

$$AS1(T)=\gamma \times AS1(T-1)+\delta \times [DS1(T)-OS1(T-1)].$$

In the above equation, AS1(T) represents the allocated share of the first task generator 1-1 at a present time T, AS1(T−1) represents the allocated share of the first task generator 1-1 at an immediately preceding time T−1, DS1(T) represents the target share of the first task generator 1-1 at the present time T, and OS1(T−1) represents the measured share of the first task generator 1-1 at the immediately preceding time. In an embodiment, the share controller 130 stores the allocated share AS1(T−1) of the first task generator 1-1 at the immediately preceding time T−1, and the task scheduler 110 stores the measured share OS1(T−1) of the first task generator 1-1 at the immediately preceding time T−1. For example, a time interval between the present time T and the immediately preceding time T−1 corresponds to a period (e.g., μs) of a clock signal (not shown) provided to the task scheduler 110 and the share controller 130.

In the above equation, γ and δ are proportional constants, which may vary with a type of the task generator 1-1, 1-2, or 1-3. The proportional constants γ and δ may be determined such that the measured share of the first task generator 1-1 can converge to the target share of the first task generator 1-1 by repeatedly updating the allocated share of the first task generator 1-1 based on the above equation. In an embodiment, each of the proportional constants γ and δ may be determined through a parameter tuning method generally being used in control theory.

The above equation illustrates a control operation of the share controller 130 according to an embodiment. However, embodiments of the present disclosure are not limited thereto, and a different equation may be used according to another embodiment.

In an embodiment, each of the task controllers 140-1, 140-2, and 140-3 determines a target share in response to a target state and a current state.

The target state and the current state may be different depending on the type of the task from the task generator 1-1, 1-2, or 1-3 in FIG. 2, as will be described below in more detail with reference to FIG. 3.

Figure 3:
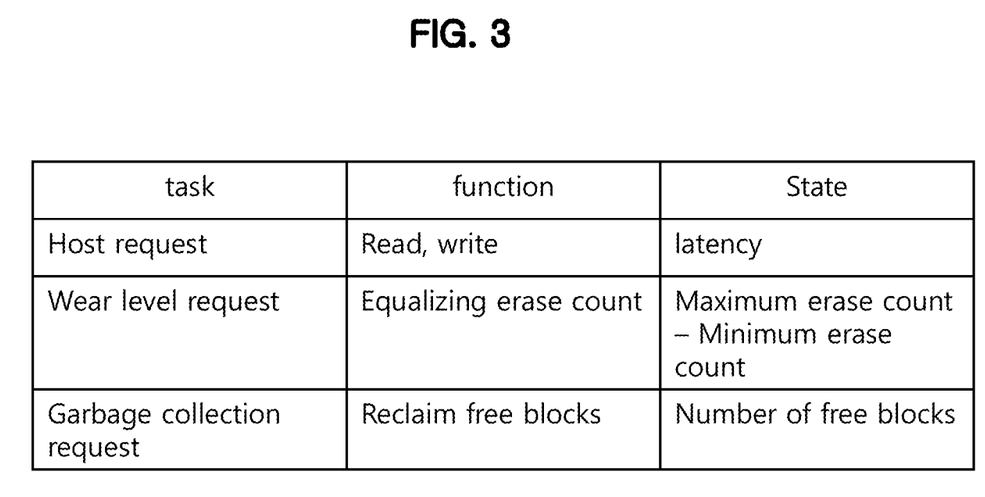
FIG. 3 illustrates a table representing tasks, and functions and states corresponding to the tasks, according to an embodiment.

FIG. 3 illustrates a table of tasks, functions, and states according to an embodiment. In the embodiment shown in FIG. 3, the functions and states correspond to the purposes and performance-related states of the tasks, respectively.

The tasks include a host request provided from a first task generator (e.g., the host 1-1 in FIG. 2), a wear leveling request provided from a second task generator (e.g., the wear level controller 1-2 in FIG. 2), and a garbage collection request provided from a third task generator (e.g., the garbage collection controller 1-3 in FIG. 2).

In the embodiment shown in FIG. 3, the host request is a read/write request and can use latency as the state.

Accordingly, the first task controller 140-1 sets a target share for the read/write request according to a target latency and a measured latency provided from the first task generator 1-1. The target latency may be predetermined according to a system requirement.

The first task generator 1-1 may calculate the measured latency indicating a time interval between a first time when the read/write request is transmitted to the task scheduler 110 and a second time when a response signal RESP2 corresponding to the read/write request is received from the response buffer 120. The first task generator 1-1 generates a first measured state signal MS1 indicating the measured latency and provides the first measured state signal MS1 to the first task controller 140-1.

The first task controller 140-1 can increase the target share when the measured latency is longer than the target latency and decrease the target share when the measured latency is shorter than the target latency.

The first task controller 140-1 may use the following equation, for example, to determine the target share of the 1st task generator 1-1:

$$DS1(T)=\alpha \times DS1(T-1)+\beta \times [DST1(T)-CST1(T-1)].$$

In the above equation, DST1(T) represents the target latency at the present time T, CST1 (T−1) represents the measured latency at the immediately preceding time T−1, DS1(T) represents the target share of the 1st task generator 1-1 at the present time T, and DS1(T−1) represents the target share of the 1st task generator at the immediately preceding time T−1.

In the above equation, α and β are proportional constants, which can have different values depending on the type of the task controller 140-1, 140-2, or 140-3. The proportional constants a and β may be determined such that the measured latency can converge to the target latency by repeatedly updating the first value of the target share based on the above equation. In an embodiment, each of the proportional constants α and β may be determined through a parameter tuning method generally used in control theory.

The wear level request is associated with an operation for leveling a number of erase operations across physical blocks of the memory device 30 (e.g., a flash memory device), and may use a difference between a maximum erase count of respective erase counts of the physical blocks and a minimum erase count of the respective erase counts of the physical blocks in the flash memory device 30 as state information. For example, a measured difference between the maximum erase count and the minimum erase count in the flash memory device 30 becomes equal to a target difference using the wear level request.

Accordingly, the second task controller 140-2 generates the second value of the target share for the wear level request based on the target difference and the measured difference provided by the second task generator 1-2.

For example, the second task generator 1-2 can manage erase count information for each block of the flash memory device 30. The second task generator 1-2 generates a second measured state signal MS2 indicating the measured difference and provides the second measured state signal MS2 to the second task controller 140-2.

The second task controller 140-2 can increase the second value of the target share when the measured difference is larger than the target difference and decrease the second value of the target share when the measured difference is smaller than the target difference.

The garbage collection request is associated with an operation of reclaiming a free block in the flash memory device 30 and can use a number of available free blocks in the flash memory device 30 as state information. For example, a measured number of free blocks in the flash memory device 30 becomes equal to a target number of free blocks using the garbage collection request.

Accordingly, the third task controller 140-3 generates the third value of the target share for the garbage collection request based on the target number of free blocks and the measured number of free blocks provided by the third task generator 1-3.

The third task generator 1-3 can manage the number of the free blocks in the memory device 30. The third task generator 1-3 generates a third measured state signal MS3 indicating the measured number of free blocks and provides the third measured state signal MS3 to the third task controller 140-3.

The third task controller 140-3 can decrease the third value of the target share when the measured number of free blocks is larger than the target number of free blocks and increase the third value of the target share when the measured number is smaller than the target number.

The target states (e.g., the target latency, the target difference between the between the maximum erase count and the minimum erase count, and the target number of free blocks) can be adjusted during an operation of the memory system 40.

For example, a value of each of the target states can be set according to a predetermined schedule or through a user interrupt operation for the system 40.

As described above, according to embodiments of the present disclosure, the scheduling can be flexibly controlled for a plurality of types of tasks by adjusting one or more values of a plurality of target states respectively corresponding to the plurality of types of tasks.

In addition, the performance of a system (e.g., the memory system 40 in FIG. 2) may be adjusted freely in real time. For example, when one or more values of the target states are set through the user interrupt operation, the operation of the system 40 may be adjusted in real time.

Figure 4:
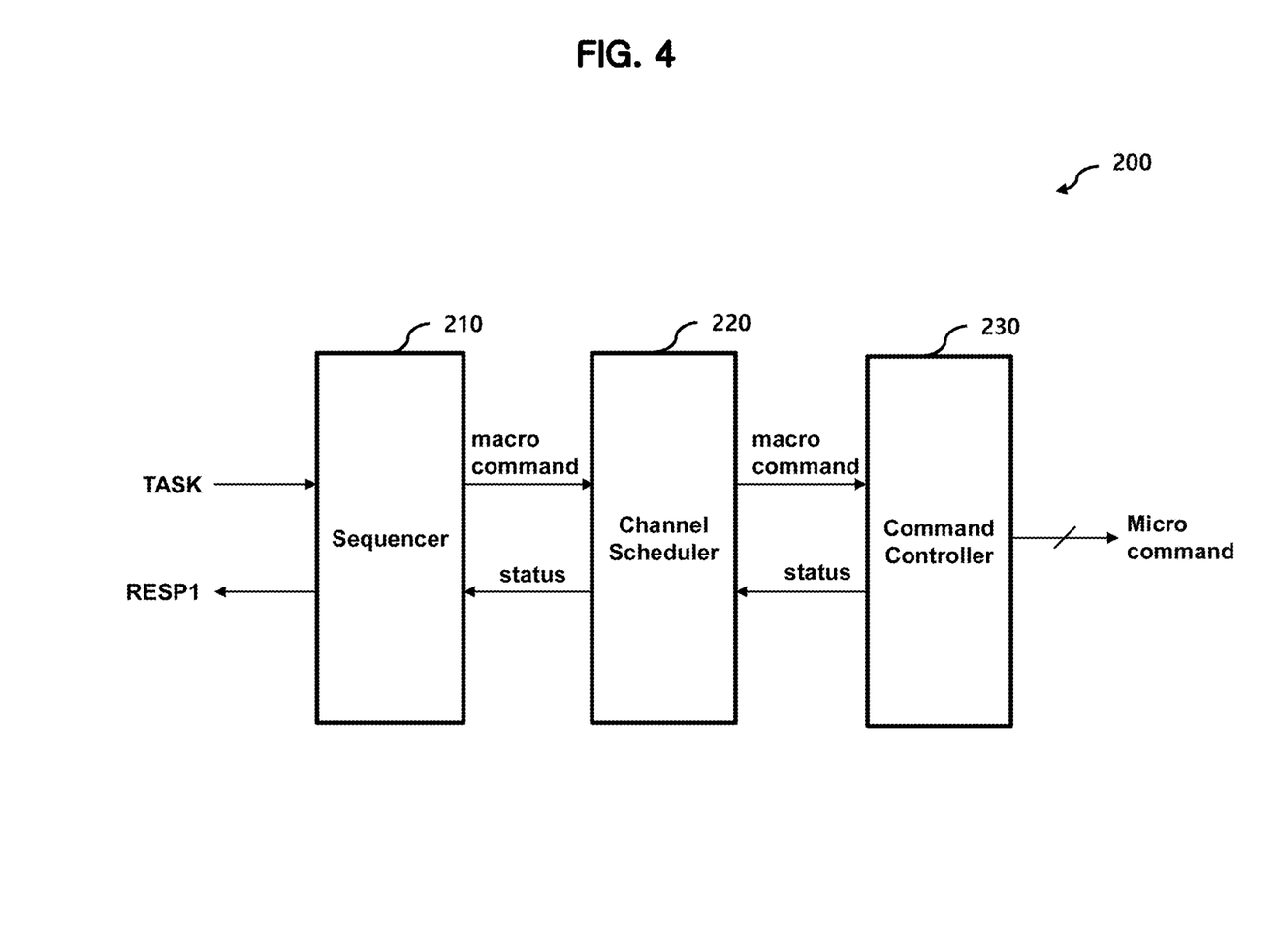
FIG. 4 illustrates a controller of FIG. 2 according to an embodiment.

FIG. 4 illustrates a controller 200 according to an embodiment of the present disclosure.

The controller 200 includes a sequencer 210, a channel scheduler 220, and a command controller 230.

The sequencer 210 receives a signal TASK indicating a selected task by a task scheduler (e.g., the task scheduler 110 in FIG. 2) and generates a plurality of macro commands corresponding the selected task.

For example, a macro command corresponding to a read request includes an activation command, a data command, and a status command.

The activation command places a flash memory device (e.g., the memory device 30 in FIG. 2) in a read-ready state for an address to be read.

The data command causes data to be output from one or more memory cells of the flash memory device, the one or more memory cells corresponding to the address to be read.

The status command indicates whether a read operation associate with the read request has been completed or not for the memory cells corresponding to the address to be read.

The channel scheduler 220 determines a processing order of the plurality of macro commands to efficiently use a plurality of channels and a plurality of flash chips.

A memory device (e.g., the memory device 30 in FIG. 2) includes the plurality of flash chips and may be coupled to the controller 200 via the plurality of channels.

For example, if a particular channel is in use, scheduling may be performed to use a different channel.

The command controller 230 generates one or more micro commands corresponding to the selected macro command to control the memory device 30.

The micro commands may include a plurality of signals for directly controlling the flash chip.

For example, the micro commands may include a chip enable signal CE, a read enable signal RE, a write enable signal WE, a data signal DQ, a data strobe signal DQS, and the like.

As disclosed above, a processing speed for a memory device (e.g., the memory device 30 in FIG. 2) according to an embodiment can be improved overall by increasing a share for a task generator having a high priority when priorities of a plurality of task generators varies.

Although various embodiments have been described for illustrative purposes, it will be apparent to those skilled in the art that various changes and modifications may be possible.

What is claimed is:

1. A semiconductor device comprising:
 a task controller configured to generate a target share for
  a plurality of task generators according to respective target states and respective measured states of the plurality of task generators;
a task scheduler configured to schedule the plurality of tasks according to an allocated share, the plurality of tasks being provided from the plurality of task generators, the allocated share being a ratio at which the task scheduler schedules the plurality of tasks from the plurality of task generators; and
a share controller configured to determine the allocated share according to the target share and a measured share of the plurality of task generators,
wherein the plurality of task generators include a first task generator configured to generate one or both of a read request and a write request for one or more of memory cells in a memory device, a second task generator configured to control a wear level operation for the memory device, and a third task generator configured to control a garbage collection operation for the memory device, and
wherein the task controller includes:
a first task controller configured to determine a first value of the target share according to a first target state for the first task generator and a first measured state of the first task generator, the first value of the target share indicating a first target share for a first task from the first task generator;
a second task controller configured to determine a second value of the target share according to a second target state for the second task generator and a second measured state of the second task generator, the second value of the target share indicating a second target share for a second task from the second task generator; and
a third task controller configured to determine a third value of the target share according to a third target state for the third task generator and a third measured state of the third task generator, the third value of the target share indicating a third target share for a third task from the third task generator.

2. The semiconductor device of claim 1, further comprising:
a controller configured to generate a command to control a memory device according to a task selected by the task scheduler.

3. The semiconductor device of claim 2, further comprising:
a response buffer configured to provide the plurality of task generators with a response from the controller.

4. The semiconductor device of claim 1, wherein the share controller determines the allocated share such that the measured share converges to the target share.

5. The semiconductor device of claim 1, wherein the task controller determines the target share such that each of the measured states to converge to a corresponding one of the target states.

6. The semiconductor device of claim 2, wherein the controller comprises:
a sequencer configured to convert the selected task by the task scheduler into a plurality of macro commands; and
a command controller configured to convert a macro command of the plurality of macro commands into a plurality of micro commands to directly control the memory device.

7. The semiconductor device of claim 6, wherein the memory device is connected to the controller via a plurality of channels, and
wherein the controller further includes a channel scheduler configured to select the macro command among the plurality of macro commands according to states of the plurality of channels and provides the selected macro command to the command controller.

8. A system comprising:
a memory device;
a plurality of task generators configured to respectively provide a plurality of tasks for the memory device; and
a semiconductor device configured to control the memory device according to the plurality of tasks from the plurality of task generators,
wherein the semiconductor device comprises:
a task controller configured to generate a target share for the plurality of task generators according to respective target states and respective measured states of the plurality of task generators;
a task scheduler configured to schedule the plurality of tasks according to an allocated share, the allocated share being a ratio at which the task scheduler schedules the plurality of tasks from the plurality of task generators; and
a share controller configured to determine the allocated share according to the target share and a measured share of the plurality of task generators,
wherein the plurality of task generators include a first task generator configured to generate one or both of a read request and a write request for one or more of memory cells in a memory device, a second task generator configured to control a wear level operation for the memory device, and a third task generator configured to control a garbage collection operation for the memory device, and
wherein the task controller includes:
a first task controller configured to determine a first value of the target share according to a first target state for the first task generator and a first measured state of the first task generator, the first value of the target share indicating a first target share for a first task from the first task generator;
a second task controller configured to determine a second value of the target share according to a second target state for the second task generator and a second measured state of the second task generator, the second value of the target share indicating a second target share for a second task from the second task generator; and
a third task controller configured to determine a third value of the target share according to a third target state for the third task generator and a third measured state of the third task generator, the third value of the target share indicating a third target share for a third task from the third task generator.

9. The system of claim 8, further comprising:
a controller configured to generate a command to control the memory device according to a task selected by the task scheduler.

10. The system of claim 8, further comprising:
a response buffer configured to provide the plurality of task generators with a response from the controller.

11. The system of claim 8, wherein the share controller determines the allocated share such that the measured share converges to the target share.

12. The system of claim 8, wherein the task controller determines the target share such that each of the measured states converges to a corresponding one of the target states.

13. The system of claim 9, wherein the controller comprises:
a sequencer configured to convert the selected task by the task scheduler into a plurality of macro commands; and a command controller configured to convert a macro command of the plurality of macro commands into a plurality of micro commands to directly control the memory device.

14. The system of claim 13, wherein the memory device is connected to the controller via a plurality of channels, and
wherein the controller further includes a channel scheduler configured to select the macro command among the plurality of macro commands according to states of the plurality of channels and to provide the selected macro command to the command controller.

15. A semiconductor device comprising:
a plurality of task generators respectively generating a plurality of task signals and a plurality of measured state signals;
a plurality of task controllers respectively generating a plurality of target share signals in response to the plurality of measured state signals and a plurality of target state signals;
a share controller generating an allocated share signal in response to the plurality of target share signals and a measured share signal, the plurality of target share signals indicating a target share and the measured share signal indicating a measured share; and
a task scheduler scheduling a plurality of tasks in response to the allocated share signal and generating the measured share signal, the plurality of task signals respectively indicating the plurality of tasks, the allocated share being a ratio at which the task scheduler schedules the plurality of tasks from the plurality of task generators,
wherein the plurality of task generators include a first task generator configured to generate one or both of a read request and a write request for one or more of memory cells in a memory device, a second task generator configured to control a wear level operation for the memory device, and a third task generator configured to control a garbage collection operation for the memory device, and
wherein the plurality of task controllers include:
a first task controller configured to determine a first value of the target share according to a first target state for the first task generator and a first measured state of the first task generator, the first value of the target share indicating a first target share for a first task from the first task generator;
a second task controller configured to determine a second value of the target share according to a second target state for the second task generator and a second measured state of the second task generator, the second value of the target share indicating a second target share for a second task from the second task generator; and
a third task controller configured to determine a third value of the target share according to a third target state for the third task generator and a third measured state of the third task generator, the third value of the target share indicating a third target share for a third task from the third task generator.

16. The semiconductor device of claim 15, wherein the task scheduler counts a number of requests associated with a task from one of the plurality of the task generators during a period of a clock signal and generates a value of the measured share signal according to the counted number.

17. The semiconductor device of claim 15,
wherein the share controller updates a plurality of values of the allocated share signal to make the measured share converge to the target share.

* * * * *